US012292462B2

(12) United States Patent
Kpoto et al.

(10) Patent No.: US 12,292,462 B2
(45) Date of Patent: May 6, 2025

(54) INDUCTANCE MEASUREMENT CIRCUITS AND METHODS USING AUTO-ADAPTIVE FLOATING TIME VOLTAGE MEASUREMENT WINDOWS

(71) Applicants: Infineon Technologies AG, Neubiberg (DE); Ecole Centrale de Lyon, Ecully (FR); Institute National Des Sciences Appliquees de Lyon, Villeurbanne (FR); Université Claude Bernard Lyon 1, Villeurbanne (FR); Centre National de La Recherche Scientifique, Paris (FR)

(72) Inventors: Koami Kpoto, Pertuis (FR); Andre Mourrier, Manosque (FR); Guy Clerc, La Tour de Salvagny (FR); Bruno Allard, Mions (FR); Federico Bribiesca Argomedo, Lyons (FR)

(73) Assignees: Infineon Technologies AG, Neubiberg (DE); Ecole Centrale de Lyon, Ecully (FR); Institute National Des Sciences Appliquees de Lyon, Villeurbanne (FR); Université Claude Bernard Lyon 1, Villeurbanne (FR); Centre National de La Recherche Scientifque, Paris (FR)

( * ) Notice: Subject to any disclaimer, the term of this patent is extended or adjusted under 35 U.S.C. 154(b) by 159 days.

(21) Appl. No.: 18/185,787

(22) Filed: Mar. 17, 2023

(65) Prior Publication Data

US 2024/0310421 A1  Sep. 19, 2024

(51) Int. Cl.
G01R 27/26 (2006.01)
G01R 31/00 (2006.01)

(52) U.S. Cl.
CPC ........ *G01R 27/2611* (2013.01); *G01R 31/005* (2013.01)

(58) Field of Classification Search
CPC .......................... G01R 27/2611; G01R 31/005
See application file for complete search history.

(56) References Cited

U.S. PATENT DOCUMENTS 4,764,694 A * 8/1988 Winroth ................... H03K 5/05
                                                    327/31
6,876,936 B2   4/2005 Ramesh et al.
(Continued)

FOREIGN PATENT DOCUMENTS

GB        2246868 A      2/1992

*Primary Examiner* — Jay Patidar
(74) *Attorney, Agent, or Firm* — Shumaker & Sieffert, P.A.

(57) ABSTRACT

This disclosure describes circuits and techniques for determining inductance on an electrical line. In some examples, a method comprises charging a capacitor in time steps to a voltage level; counting a number of the time steps to the voltage level, wherein the number of the time steps defines a coarse measurement inductance of the electrical line; measuring a charging rate associated with charging the capacitor within a measurement window that is defined at the voltage level, wherein the charging rate associated with charging the capacitor within the measurement window defines a fine measurement of the inductance of the electrical line; and outputting an indication of the number of time steps and an indication of the charging rate associated with charging the capacitor within the measurement window.

21 Claims, 7 Drawing Sheets

(56) References Cited

U.S. PATENT DOCUMENTS

| | | |
|---|---|---|
| 2010/0265051 A1 | 10/2010 | Sivertsen |
| 2011/0015823 A1 | 1/2011 | Bertosa et al. |
| 2015/0280425 A1 | 10/2015 | Kreuter et al. |
| 2020/0099176 A1 | 3/2020 | Mourrier et al. |
| 2021/0359504 A1 | 11/2021 | Mourrier et al. |

\* cited by examiner

INDUCTANCE MEASUREMENT CIRCUITS AND METHODS USING AUTO-ADAPTIVE FLOATING TIME VOLTAGE MEASUREMENT WINDOWS

TECHNICAL FIELD

This disclosure describes electrical systems, and more specifically, circuits and methods of measuring line inductance in the lines of electrical systems.

BACKGROUND

Complex electrical systems often use many electrical lines, such as wires, traces, cables, wire harnesses, or other electrical conductors that connect different components of the electrical system. For example, modern vehicles (such as automobiles or other types of vehicles) include complex electrical systems that may be connected by wire harnesses or other electrical lines. During the lifetime of the vehicle, these electrical lines can be damaged, leading to possible issues with safety, reliability, maintenance, and diagnostics. Monitoring the integrity of electrical lines (such as wire harnesses) in electrical systems (such as in a vehicle) is desirable to ensure safety and reliability, and possibly predict the need for future maintenance. This monitoring is especially desirable for electrical lines used in critical systems of vehicles, such as steering, brakes, automated driving functions, or other systems that are critical to the operation of the vehicles.

Measuring the line impedance (e.g., resistance and inductance) can be useful to help determine the operating state of electrical lines, such as wire harnesses, during their lifetime in a vehicle or other electrical device. However, it can be very challenging to measure very low inductances (such as on the order of 1uH/m) of a wire harness.

SUMMARY

This disclosure describes techniques and circuits for measuring inductance of an electrical line, such as a wire harness. The techniques and circuits of this disclosure may be useful for electric vehicles or any other electrical system where it is desirable to monitor the electrical safety of the system. The techniques may include a two-step process for measuring inductance, which includes a coarse measurement and a fine measurement. The coarse measurement may include a process of charging a capacitor in time steps and counting the number of time steps needed to charge the capacitor to a voltage level. The fine measurement may comprise a measurement of the voltage change on the capacitor over a measurement window that spans a fixed amount of time. The combination of the coarse measurement and the fine measurement may provide an accurate measure of inductance. Moreover, in contrast to conventional techniques, by bifurcating the measurements into coarse and fine measurements, as described herein, circuit clock speeds can be reduced, and the required bit depth of an analog-to-digital converter (ADC) for measuring the voltage change can be reduced.

In some examples, this disclosure describes an inductance measurement circuit comprising: a capacitor connected to an electrical line; one or more circuit elements configured to charge the capacitor in time steps to a voltage level, wherein a number of the time steps to reach the voltage level defines a coarse measurement of inductance of the electrical line; and a detection circuit configured to measure a charging rate associated with charging the capacitor within a measurement window that is defined at the voltage level, wherein the charging rate associated with charging the capacitor within the measurement window defines a fine measurement of the inductance of the electrical line, and wherein a combination of the coarse measurement and the fine measurement defines inductance of the electrical line.

In some examples, this disclosure describes a method of determining inductance on an electrical line. The method may comprise charging a capacitor in time steps to a voltage level; counting a number of the time steps to the voltage level, wherein the number of the time steps defines a coarse measurement inductance of the electrical line; measuring a charging rate associated with charging the capacitor within a measurement window that is defined at the voltage level, wherein the charging rate associated with charging the capacitor within the measurement window defines a fine measurement of the inductance of the electrical line; and outputting an indication of the number of time steps and an indication of the charging rate associated with charging the capacitor within the measurement window.

In some examples, this disclosure describes a system comprising a processor and an inductance measurement circuit connected to the processor. The inductance measurement circuit may comprise a capacitor connected to an electrical line; one or more circuit elements configured to charge the capacitor in time steps to a voltage level, wherein a number of the time steps to reach the voltage level defines a coarse measurement of inductance of the electrical line; and a detection circuit configured to measure a charging rate associated with charging the capacitor within a measurement window that is defined at the voltage level, wherein the charging rate associated with charging the capacitor within the measurement window defines a fine measurement of the inductance of the electrical line, and wherein a combination of the coarse measurement and the fine measurement defines inductance of the electrical line. The detection circuit may be configured to output indications of the coarse measurement and the fine measurement to the processor, and the processor may be configured to determine the inductance of the electrical line based on the indications of the coarse measurement and the fine measurement.

Details of these and other examples are set forth in the accompanying drawings and the description below. Other features, objects, and advantages will be apparent from the description and drawings, and from the claims.

DETAILED DESCRIPTION

Figure 1:
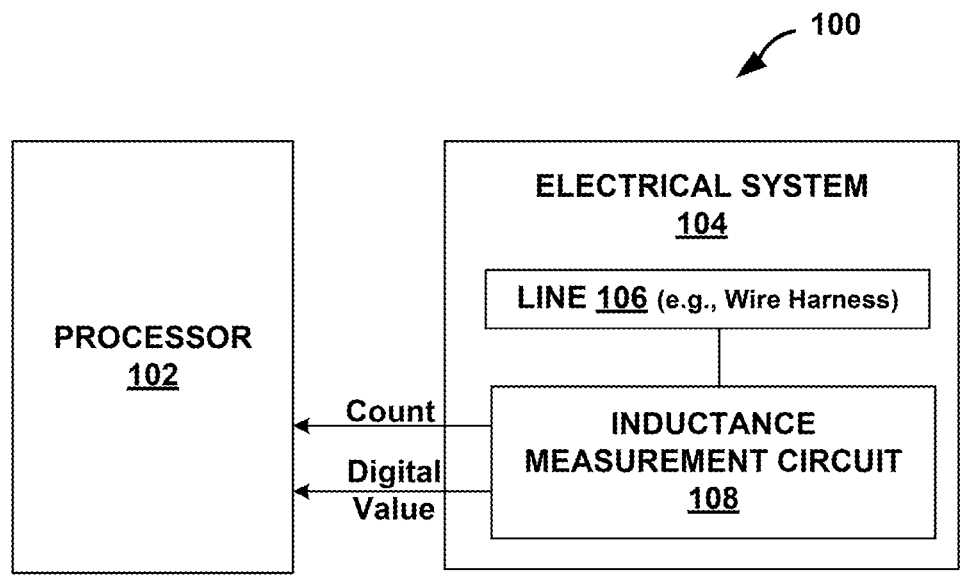
FIG. 1 is a block diagram of an example system according to this disclosure.

This disclosure describes techniques and circuits for measuring inductance of an electrical line, such as a wire harness. The techniques and circuits of this disclosure may be useful for electric vehicles or any other electrical system where it is desirable to monitor the electrical safety of the system.

As described in greater detail below, the techniques of this disclosure may include a two-step process for measuring inductance, which includes a coarse measurement and a fine measurement. The coarse measurement may include a process of charging a capacitor in time steps and counting the number of time steps needed to charge the capacitor to a voltage level. The fine measurement may comprise a measurement of voltage change on the capacitor over a measurement window that spans a fixed amount of time, which provides a measure of the charging rate associated with charging the capacitor within the measurement window. In some examples, the measurement window may comprise a circuit delay period that occurs due to the circuit response to reaching the voltage level.

An inductance measurement circuit may be configured to output a count value indicating the number of time steps to reaching the voltage level. In addition, the inductance measurement circuit may also be configured to output a digital value corresponding a change in the amount of charge that accumulates on the capacitor in the measurement window, wherein the measurement window is a fixed duration. A processor may receive the count value and the digital value from the inductance measurement circuit, and the processor may determine line inductance based on these values.

In contrast to conventional techniques, by bifurcating inductance measurements into coarse and fine measurements, as described herein, circuit clock speeds can be reduced, and the required bit depth of an analog-to-digital converter (ADC) for measuring the voltage change can be reduced. The circuit pre-charges the capacitor in time steps to a pre-defined voltage level, which defines a floating time measurement window that has higher precision than a measurement window at lower voltage levels. Again, in some examples, the measurement window may correspond to a delay window that follows the final time step for pre-charging the capacitor, e.g., a fixed and known delay period associated with circuit operation.

During their lifetime, electrical wire harnesses in vehicles can be damaged, possibly leading to issues of safety, reliability, maintenance, and diagnostics. Indeed, electrical lines and electrical connectors can age or become damaged (e.g., causing short-circuits or open circuits) due technical mistakes or the external environment. It is therefore desirable to monitor for changes in the overall system behavior that may compromise safety. In modern vehicles, for example, electrical wire harness maintenance and diagnosis is especially desirable to promote and achieve automated driving features in a safe manner.

Estimating the line impedance (e.g., both resistance and inductance) can be useful in order to be informed on the operational state of the wire harnesses during their lifetime in the vehicle. However, it can be difficult to measure very low inductances (about 1 uH/m) or resistances (5 mΩ at the connector) of the wire harness through an integrated system. Moreover, a very high level of measurement sensitivity is even harder to achieve, e.g., when it is desirable to measure very small variations (e.g., 0.1 uH) over a wide range of inductance values (e.g., 6 uH). In some examples, the techniques of this disclosure may facilitate inductance measurements on the order of 0.5 uH and variations on the order of 0.1 uH.

FIG. 1 is a block diagram of an example system 100 according to this disclosure. System 100 comprises a processor 102 and an electrical system 104. Electrical system 104 includes an electrical line 106, which may comprise a wire harness, a wire, a trace, or any other electrical conductor that is configured to connect different components of electrical system 104. Electrical system 104 also includes an inductance measurement circuit 108 that is configured to measure values indicative of the inductance of electrical line 106.

As shown in FIG. 1, inductance measurement circuit 108 may be configured to output a count value and a digital value to processor 102. The count value may indicate a number of time steps for charging a capacitor to a pre-defined voltage level, e.g., 6-10 volts. The digital value may indicate an amount of charge that accumulates on the capacitor in a pre-defined measurement window, wherein the measurement window is a fixed duration. Processor 102 may receive the count value and the digital value from the inductance measurement circuit 108, and processor 102 may determine line inductance based on these values.

As described in greater detail below, inductance measurement circuit 108 may be configured to perform a two-step process for measuring inductance, which includes a coarse measurement and a fine measurement. Inductance measurement circuit 108 may comprise a capacitor connected to electrical line 106, and one or more circuit elements (e.g., one or more power switches) configured to charge the capacitor in time steps to a voltage level, wherein a number of the time steps to reach the voltage level defines the count value, which is referred to as a coarse measurement of inductance of electrical line 106. In addition, inductance measurement circuit 108 includes a detection circuit configured to measure a charging rate associated with charging the capacitor within a measurement window that is defined at the voltage level, wherein the charging rate associated with charging the capacitor within the measurement window defines a fine measurement of the inductance of the electrical line. The fine measurement corresponds to the digital value, which can define the charge rate over a fixed and pre-defined measurement window. The digital value may be output from inductance measurement circuit 108 via an ADC. A combination of the coarse measurement (the count) and the fine measurement (the digital value) defines inductance of the electrical line, which can be used by processor 102 for system level control or system level response. In some examples, processor 102 may be configured to output a fault signal, or possibly limit or disable electrical system 104, in response to identifying a line inductance that is unacceptable (e.g., outside an acceptable range of inductance values).

Figure 2:
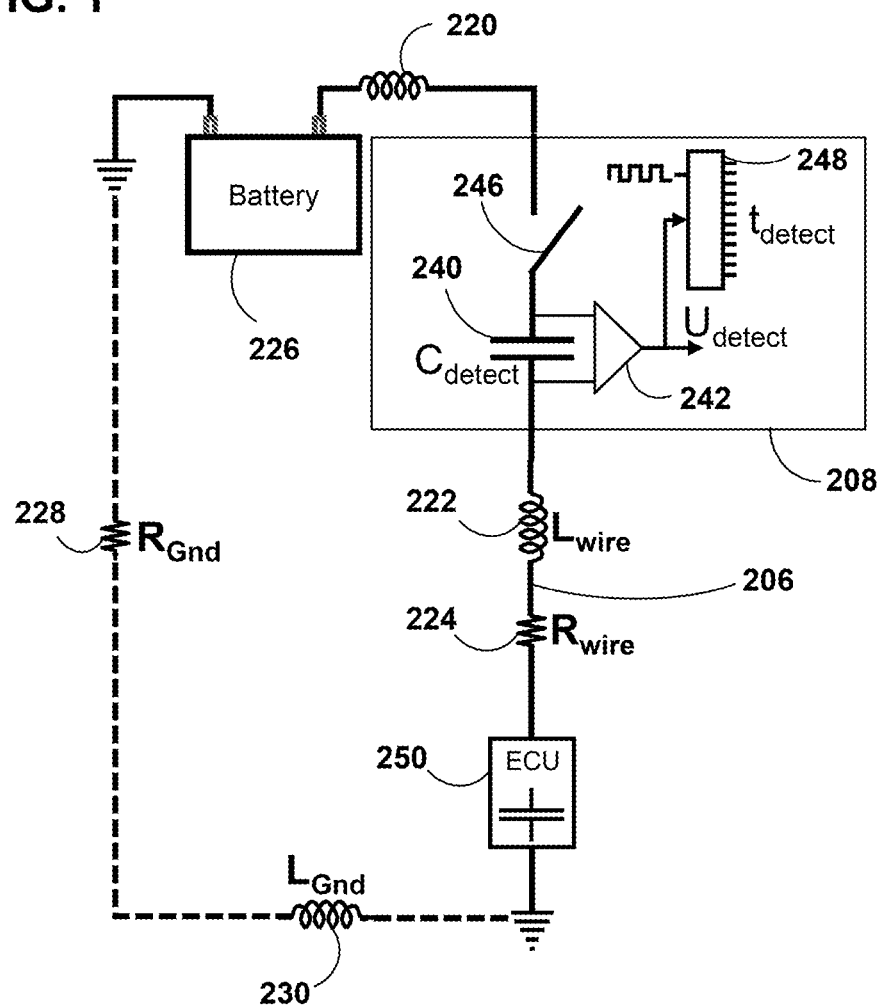
FIG. 2 is a circuit diagram showing an example circuit according to this disclosure.

FIG. 2 is a circuit diagram showing an example circuit according to this disclosure. In the circuit of FIG. 2, a battery 226 is configured to deliver power to a load, such as an electronic control unit (ECU) 250. ECU 250, for example, may comprise an ECU used in automotive electrical systems, e.g., for controlling steering, brakes, automated driving functions, or any other vehicle functions. Electrical line 206 connects battery 226 to ECU 250, and electrical line 206 defines an impedance, which may comprise a combination of wire inductance 222 and wire resistance 224. Measuring and monitoring the inductance of electrical line 206 may be desirable. Indeed, inductance and resistance can change over time, e.g., due to aging, degradation, environmental factors, or other reasons. According to this disclosure, an inductance measurement circuit 208 is configured to measure the inductance of electrical line in a way that can achieve high accuracy within an integrated circuit solution. The two-step techniques of this disclosure may help to reduce clock speed and ADC size to ranges that can be implemented effectively within inductance measurement circuit 208 as a fully integrated circuit, e.g., on a common substrate of silicon.

For completeness, the system shown in FIG. 2 illustrates the resistance to ground 228 and the inductance to ground 230, as well as inductance 220 between battery 226 and inductance measurement circuit 208.

Inductance measurement circuit 208 includes a capacitor 240 connected to electrical line 206, and one or more circuit elements (e.g., power switch 246) configured to charge capacitor 240 in time steps to a voltage level. The voltage level and the size of the time steps may be pre-defined (e.g., 6-10 volts) to define an effective measurement window. A counter 248 is configured to count the number of time steps to reach the voltage level. In this way, a count value stored by counter 248 defines a coarse measurement of inductance of electrical line 206. A detection circuit 242 is also configured to measure a charging rate associated with charging capacitor 240 within a measurement window that is defined at the voltage level. The size of the measurement window may be fixed, and therefore, by detecting a voltage level U that represents the change in voltage on capacitor 240 over the known measurement window, voltage level U can indicate the rate of change on capacitor 240, which may define a fine measurement of inductance of electrical line 206. Inductance measurement circuit 208 may be configured to output the count value of the number of time steps to reach the voltage level, and output a digital value indicating the voltage change on capacitor 240 over a known measurement window. A processor (not shown in FIG. 2) may receive the count value and the digital value, and these values can provide a precise indication of inductance of electrical line 106.

Figure 3:
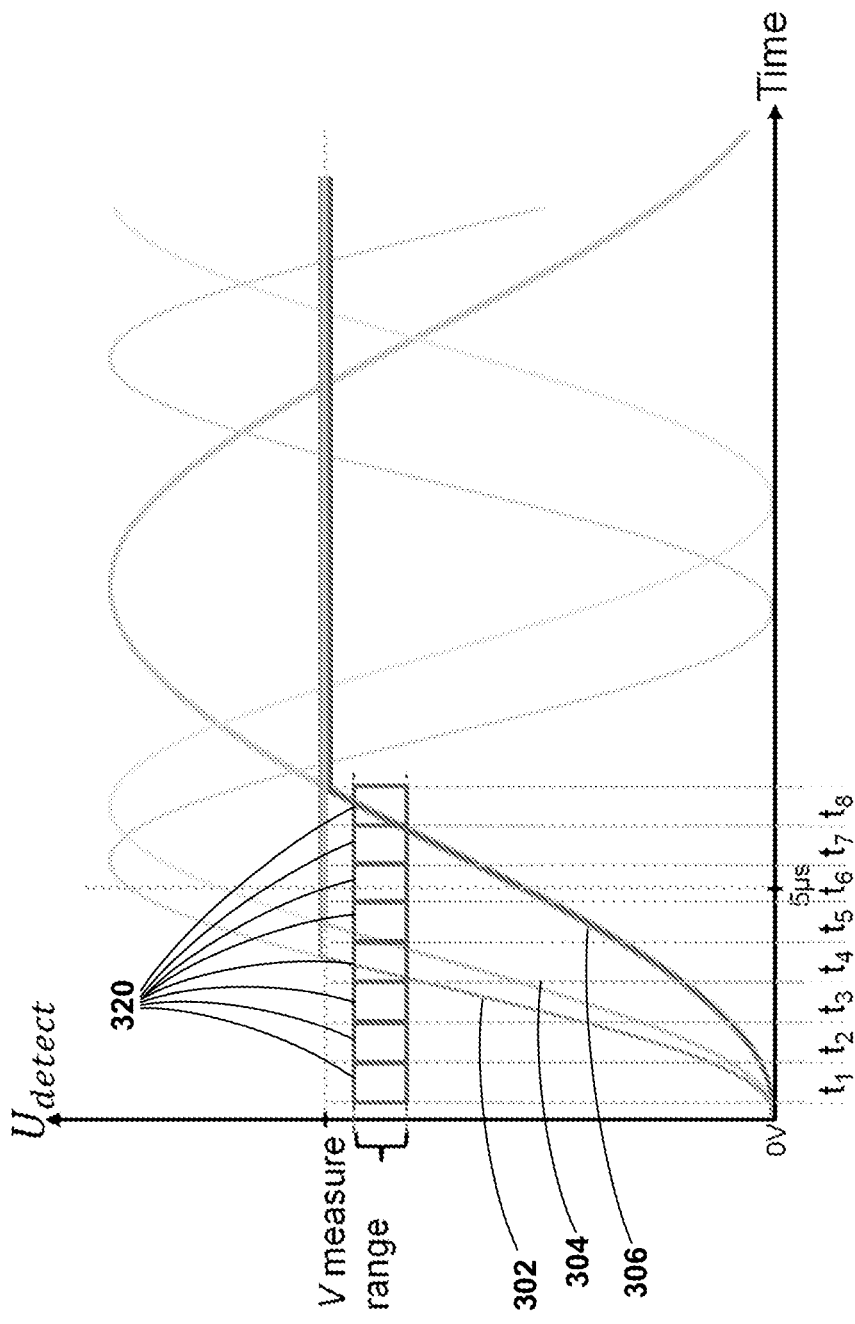
FIG. 3 is a graph showing time steps and measurement windows positioned relative to curves that define different levels of inductance.

FIG. 3 is a graph showing time steps and measurement windows positioned relative to curves that define different levels of inductance. In particular, FIG. 3 shows three different inductance curves 302, 304, and 306, which represent different inductances associated with different electrical lines or different inductances of a given electrical line in different situations or environments. As shown, inductance curves 302, 304, and 306 are a function of voltage and time. In other words, the inductance of a given line affects the amount of time that it takes charge to pass through that line with a given voltage, or alternatively, affects the level of voltage that can be seen on the line as a function of time. However, using solely time-based measurements or using solely voltage-based measurements is difficult for an integrated circuit implementation, as it may require very high clock speeds (e.g., on the order of 100 Megahertz) or very precise voltage measurements (e.g., bit depths of 8 bits or greater). In some examples of this disclosure, by bifurcating the measurements into coarse measurements based on time and fine measurements based on voltage, circuit clock speeds can be reduced and the required bit depth of an ADC for measuring the voltage change can be reduced. Moreover, the level of sensitivity that is desired for the circuit can be adjusted or modified by defining the bit depth of the ADC and the clock frequency of the system clock used. Thus, in some cases, a bit depth associated with the digital value and a clock frequency associated with the detection circuit are defined based on a level of sensitivity to be achieved by the inductance measurement circuit.

Measurement windows 320 are illustrated conceptually in FIG. 3. As shown, different ones of measurement windows 320 correspond to different time slots $t_1$, $t_2$, $t_3$, $t_4$, $t_5$, $t_6$, $t_7$, $t_8$ at a given voltage level. Thus, by counting the number of time slots to a pre-defined voltage level, this provides a coarse measurement of the inductance curve, i.e., a coarse measurement of an amount of time that it takes to charge a capacitor to the given voltage level. Then, at that voltage level, a given one of measurement windows 320 associated with a given time slot (e.g., $t_1$, $t_2$, $t_3$, $t_4$, $t_5$, $t_6$, $t_7$, or $t_8$) is used to measure voltage change on the capacitor in that measurement window. By fixing the size of the measurement window to a known length of time, the voltage change over that measurement window indicates a charge rate, which provides a fine measurement of the inductance curve. In some examples, the measurement window corresponds to a fixed delay period that occurs after the capacitor (e.g., capacitor 240) is charged to the pre-defined voltage level.

Referring again to FIG. 2, counter 248 may be configured to count the number of time steps and output an indication of the number of time steps to a processor. An ADC (not shown in FIG. 2) may be configured to output a digital value to the processor, the digital value corresponding to the value Udetect, indicating an amount of charging the capacitor within the measurement window. Again, since the measurement window has a fixed duration, the amount of charging Udetect can define the charge rate over the measurement window. In some examples, the digital value output by the ADC of an inductance measurement may comprise fewer than 6 bits (e.g., 4 bits), and a clock frequency associated with the detection circuit is on the order of 10 Megahertz. These values can make an integrated circuit solution desirable and effective for the inductance measurement circuit. Accordingly, the inductance measurement circuit of this disclosure may comprise an integrated circuit formed in a common substrate of silicon.

Switch 246 may comprise one or more power switches configured to connect capacitor 240 to a supply voltage (e.g., battery 226) in the time steps. In other words, switch 246 connects capacitor 240 to battery 226 in short time intervals (e.g., time steps) of fixed durations. Thus, each of the time steps corresponds to an increase in the voltage level associated with the coarse measurement, and by counting the number of time steps to a particular voltage level, via counter 248, inductance measurement circuit 208 determines a coarse measurement of the inductance (such as shown in FIG. 3). For the fine measurement at that pre-defined voltage level, detection circuit 242 may comprise a comparator circuit connected to each side of capacitor 240. The comparator circuit (e.g., detection circuit 242) may be configured to output a signal indicating an amount of charging within the measurement window. Again, since the measurement window has a fixed duration, signal indicating the amount of charging (in combination with the fixed duration) defines the charge rate. The charge rate may generally correspond to the slope of a given curve (e.g., curve 302, 304, or 306) within a very small measurement window (e.g., a corresponding one of measurement windows 320).

To measure inductance, some measurement apparatus may use simulation methods to supply a well-known excitation signal to the inductor in such a way that the excitation signal has a controlled current or voltage source, waveform and frequency. An LCR (Inductance/Capacitance/Resistance) meter is one device that may be used to measure either inductance, capacitance, or resistance. An LCR meter may use an auto balancing bridge technique. By using a built-in sinusoidal signal generator and a bridge balancing technique, the LCR meter excites the device under test and measures the appropriate impedance of the inductor. However, in real use conditions, signals are often not sinusoidal but dependent on the wave shape, excitation level, and operating frequency of its system as well as its surrounding environment.

Another technique that may be used to measure inductance under real time environment is to calculate the slope of the B-H curve (where B is the magnetic flux and H is the magnetizing current). However, measuring the slope of the B-H curve can be a very complex process, which may need thorough analysis.

It may also be possible to measure inductance by exciting the inductor with voltage step and measure the current variation and the variation time. Then, inductance can be calculated by using the following formulas:

$$L = U * \Delta t / \Delta I$$

where L is the measured inductance, U the step voltage magnitude, I the current flowing through the inductor, and $\Delta t$ the time during which the current had varied.

Some methods may be able to measure inductance with an acceptable accuracy depending on the device under measurement. However, some techniques are not practically integrable in a circuit, since they may need an apparatus like an LCR meter, oscilloscope, voltmeter, or ammeter. Moreover, some methods are quite intrusive, and using some methods may require full access to the inductor.

One possibly integrable technique may utilize a series LC circuit with a capacitor (C) and an inductor (L). Then, analysis can be performed on the voltage across the capacitor while the LC circuit is subjected to an excitation signal. For instance, by applying a voltage step excitation into a series LC circuit, the voltage across the capacitor typically oscillates depending on the value of the inductance such that ω=2/√LC (where w is the oscillation natural frequency). With this method, however, sensitivity becomes limited if inductance variation is very low (e.g., 0.1 uH). Another way to determine inductance is to supply the voltage step to the series LC circuit and to measure the time that the capacitor needs to be charged to a specified voltage. Again, the charging time is related to the inductance, but the sensitivity of the technique may be limited. In some examples, the techniques of this disclosure may be based on a combination of these time-based techniques and voltage-based techniques, in order to increase the sensitivity regarding inductance variation.

In some examples, based on a series LC circuit, a method may include charging a capacitor and measuring the charging time and voltage across the capacitor. Actually, for comparison purposes, there may be several ways to perform the measurement:

Consider a specified voltage $V_d$ above which the charging is stopped and record the charging time of capacitor→$T_d$ Or, consider a predefined charging time ($t_d$) at which the voltage across the capacitor→$U_d$ is measured.

To give a practical view on some techniques of this disclosure, consider the case of a wire section inductance measurement in a vehicle. More specifically, consider a typical circuit that includes a wire harness in a power network, such as shown in FIG. 2. FIG. 2 shows the load (e.g., ECU 250) supplied by battery 226 through the section of wire which is modeled by RL series elements. Capacitor 240 labeled as $C_{detect}$ can be viewed as a sensor capacitor across which the voltage $U_{detect}$ is measured.

If R and L are respectively the equivalent resistance and inductance of the measured loop, the measured voltage across capacitor $C_{detect}$ is an RLC step response as described by the equation 1.

$$u_{det}(t) = V_{bat}\left(1 - \left(\cos(\omega t) - \left(\frac{\lambda}{\omega_0}\right) * \sin(\omega_0 t)\right)e^{-\lambda t}\right) \quad \text{Equation 1}$$

where:

$\omega_0 = \dfrac{1}{\sqrt{LC_{detect}}}$     natural frequency $\lambda = \dfrac{R}{2L}$     damping factor $\alpha = \dfrac{\lambda}{\omega_0}$     damping coefficient $Q = \dfrac{1}{2\alpha} = \dfrac{L\omega_0}{R} = \dfrac{1}{RC\omega_0}$     quality factor So, if a first method (e.g., a time measurement method) is considered, for any variation of inductance L ($L_1$ to $L_2$), it can be seen a variation in the charging time $\Delta t = T_{d1} - T_{d2}$ of the sensor capacitor. Additionally or alternatively, a second method (e.g., a voltage measurement method) may be used to determine the voltage change over a given amount of time.

The techniques of this disclosure, in some examples, can be viewed as a combination of the time measurement method and the voltage measurement method in such a way that the sensitivity to detect the inductance variation is increased. Indeed, instead of considering either the time or the voltage measurement method, techniques of this disclosure may comprise measuring the charging time while the capacitor voltage is between a predefined range. The concept may be referred to herein as an auto-adaptive time floating voltage measurement, one example of which is depicted in FIG. 4.

Figure 4:
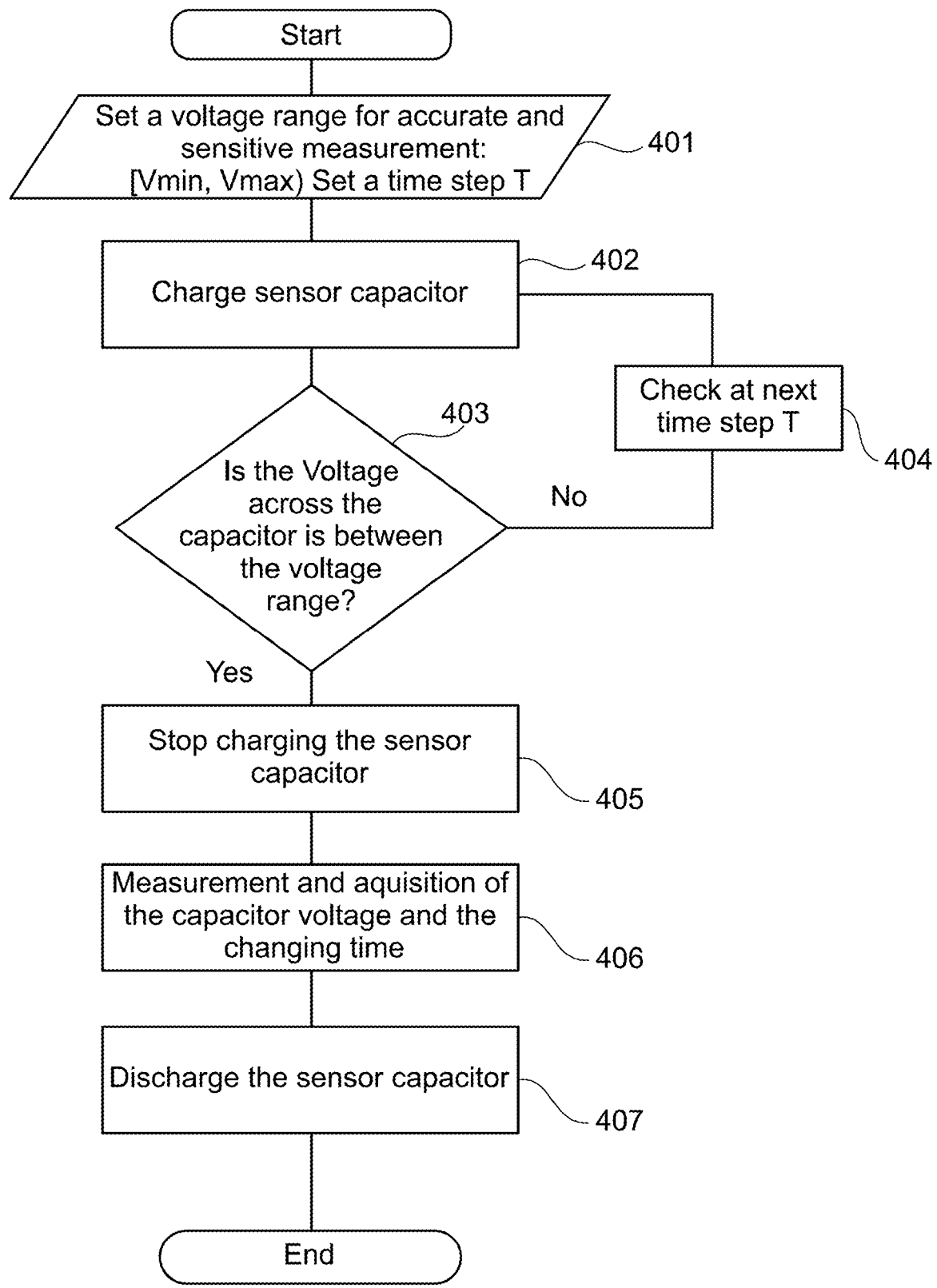
FIG. 4 is a flow diagram showing a method consistent with this disclosure.

FIG. 4 is a flow diagram showing a method consistent with this disclosure, which may be performed by an inductance measurement circuit, such as circuit 108 or circuit 208 of FIGS. 1 and 2. As shown in FIG. 4, the circuit is configured to set a voltage range (e.g., Vmin, Vmax) for accurate and sensitive measurement (401), and the circuit may also be configured to set a time step T (401). The circuit charges a sense capacitor in time steps. In particular, the circuit charges sense capacitor (402) and determines if the voltage across the capacitor is between the set voltage range (403). If not (no branch of 403), the circuit proceeds to the next time step (404) and again charges the sense capacitor in the next time step (402).

Once the voltage on the capacitor is within the set voltage range (yes branch of 403), the circuit stops charging the capacitor (405), and the circuit measures and acquires a capacitor voltage over a pre-defined charging time (e.g., a fixed measurement window) (406). The circuit then discharges the capacitor (407). A count value of the number of time steps to the voltage level within the voltage range in combination with a value indicating the amount of charge that accumulated in the pre-defined measurement window provides an accurate measure of line inductance.

One potential advantage to the method shown in FIG. 4 is a desirable increase in the sensitivity of the inductance variation detection relative to conventional techniques. Moreover, increasing the sensitivity may allow for a reduction in the size of an ADC, which can be used for the fine measurement. Table 1, shows a comparison between a time-based method, a voltage-based method, and the auto-adaptive time floating voltage measurement methods described herein, based on three criteria: ADC size, clock frequency, and sensitivity.

TABLE 1

Comparison of measurement methods

| Method | Sensitivity | Clock frequency | ADC size |
|---|---|---|---|
| Time measurement | $\frac{0.1 \text{ uH}}{6 \text{ uH}} = 1.67\%$ | 100 MHz | 9 Bits |
| Voltage measurement | | 10 MHZ | 10 Bits |
| Auto-adaptive time floating voltage measurement | | 10 MHz | 4 Bits |

Figure 5:
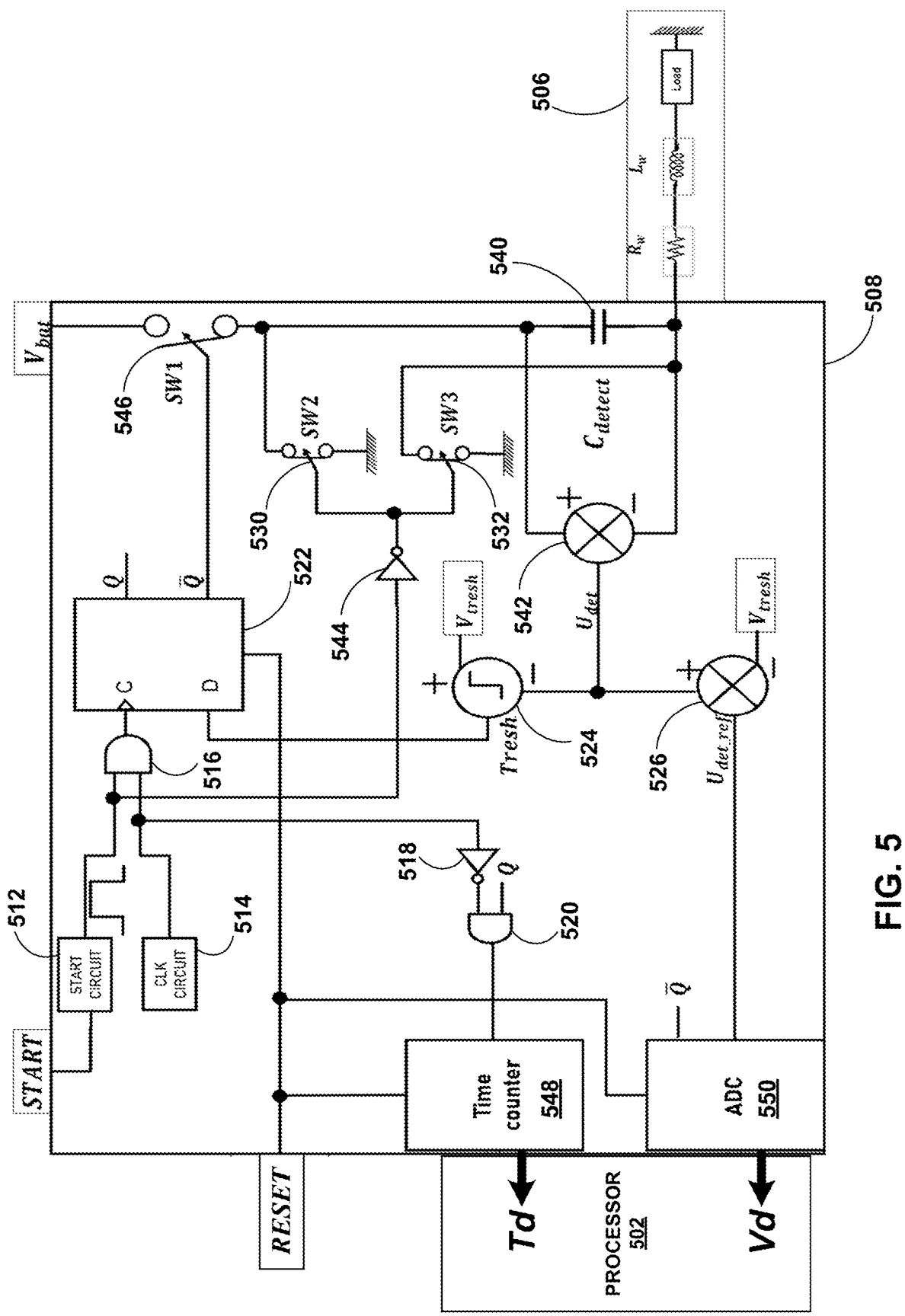
FIG. 5 is another circuit diagram consistent with this disclosure.

FIG. 5 is another circuit diagram consistent with this disclosure, showing a more detailed example of an inductance measurement circuit 508 consistent with this disclosure. As shown, inductance measurement circuit 508 is connected to an electrical line 506, which may include a load. Electrical line 506 defines a line inductance $L_w$ and a line resistance $R_w$. Circuit 508 is one example circuit configured to measure the line inductance of electrical line 506.

Circuit 508 includes a start circuit 512 configured to receive a start signal (labeled START) from another circuit or processor 502. A clock circuit 514 sets a system clock for circuit. Logic 516 is connected to circuits 512, 514 and is configured to set a memory element (e.g., flip flop 522) based on the signals from circuits 512, 514. The state of flip flop 522 controls the on/off state of power switch 546 to provide time stepped charging of capacitor 540 by connecting capacitor 540 to a battery voltage Vbat in time steps. Time counter 548 is connected to logic elements 520, 518 (e.g., an inverted amplifier 518 and an AND gate 520). Time counter 548 is configured in this way to count the number of time steps associated with charging capacitor 540 to a voltage level that is between two thresholds, which may be stored in memory elements and monitored by logic elements 524, 526. Time counter 548 outputs a count value (Td) to processor 502 indicative of the number time steps needed to charge capacitor 540 to a voltage level that is in the pre-defined range.

Once capacitor 540 is changed to a voltage level in the pre-defined voltage range, logic element 544 (e.g., an inverted amplifier) is controlled to cause switches 530, 532 to discharge capacitor 540. Prior to this, logic element 542 (e.g., a compare circuit) is configured to detect the voltage change $U_{det}$ on capacitor 540 over a pre-defined measurement window. The measurement window, for example, may comprise a fixed and pre-known delay period associated with the charging cycle on capacitor 540. The change in voltage over capacitor 540 over the measurement window is provided to ADC 550, which outputs a digital value (Vd) of this change to processor 502. A reset signal (labeled RESET) from processor 502 or another circuit can be used to reset the process.

For example, a measurement begins when START signal (e.g., from a microprocessor) is high while the clock circuit is active. Then, flip flop 522 state becomes Q=1 initiating the charging (SW1 546 is closed) of capacitor $C_{detect}$ 540 (initially discharged) and time counter 548 starts counting the number of time steps (defined by the state of clock circuit 514) associated with the charging time. Comparator 542 may comprise an operational amplifier in comparator mode, which checks continuously the voltage across capacitor 540 $C_{detect}$. Once the voltage across capacitor 540 $C_{detect}$ reaches a threshold voltage $V_{tresh}$, comparator 542 changes state. At the next rising edge of the clock, flip flop 522 changes states also: Q=0. So, the charging is stopped (SW1 546 is opened) and time counter 548 is stopped. Then, an ADC 550 converts the measured value of the voltage across the capacitor 540 to a digital format. At the end of conversion, both voltage $V_d$ and recorded charging time $T_d$ are sent to processor 502 for data processing. Finally, capacitor 540, as well as any load capacitor, is discharged through SW2 530 and SW3 532.

Figure 6:
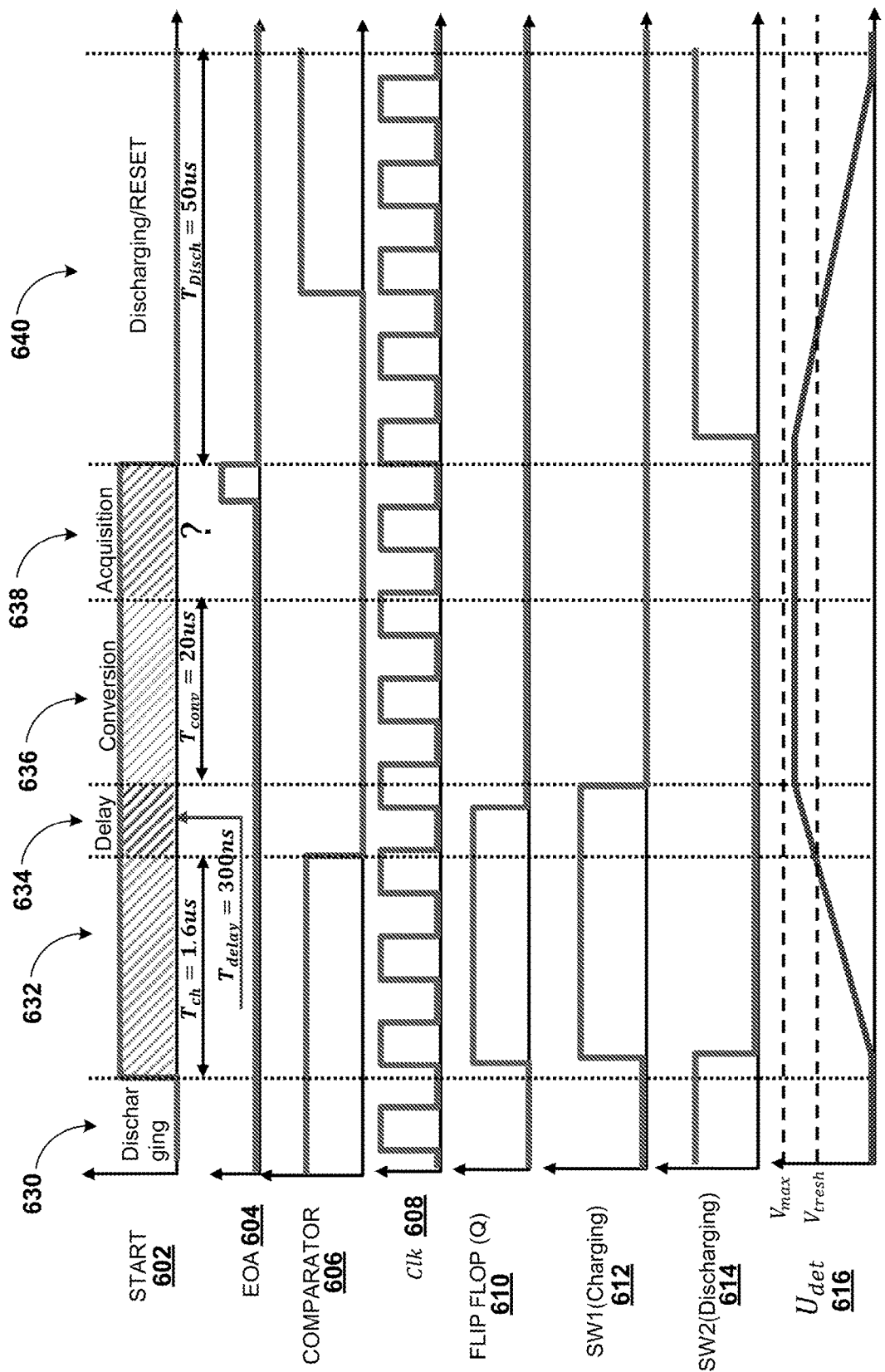
FIG. 6 is a set of graphs showing different signals consistent with this disclosure.

FIG. 6 is a set of timing diagrams showing time characteristics of various signals of inductance measurement circuit 508 in operation, which may demonstrate one or more aspects of this disclosure. Signal 602 is the logic signal labeled START in FIG. 5. Signal 604 is an end of acquisition (EOA) logic signal that causes time counter 548 and ADC 550 to output the measured values to processor 502. Signal 604 is the signal on comparator 542. Signal 608 is the clock signal generated by clock circuit 514. Signal 610 shows the state of flip flop 522. Signal 612 shows SW1 546 in a charging phase, which may correspond to both the time-step based charging and the charging that further occurs in the measurement window. Signal 614 shows the discharging phase, e.g., associated with SW2 530 being in a conducting phase. And signal 616 shows the voltage $U_{det}$ that is present on capacitor 540 over time.

In phase 630, there is no charge on capacitor 540. Time-stepped charging of capacitor 540 is shown in phase 632 where the charge accumulates on capacitor in a linear manner (albeit in a time-stepped way that is not illustrated in signal 616). The charging phase is shown as 1.6 microseconds, but may vary depending on the level of change needed, the inductance, and the defined thresholds. Phase 634 is a delay window that defines the measurement window for the fine "voltage-based" measurement of the rate of change of voltage on capacitor 540 within the delay window of phase 634. This delay in phase 634 may occur for a pre-defined amount of time (e.g., 300 Nanoseconds) following comparator 542 detecting a voltage level that satisfies the pre-defined voltage level. Phase 636 corresponds to a conversion time, e.g., 20 microseconds, for ADC 550 to convert the analog measurement to a digital value that is indicative of the change in voltage on capacitor 540 over the measurement window (e.g., the delay window) of phase 634. Phase 638 defines an acquisition time for sending information from time counter 548 and ADC 550 to processor 502.

The techniques and circuits described herein can achieve inductance measurements with inductance variations of very high sensitivity (about 1.67%) while reducing the size of ADC (e.g., from 10 bits to 4 bits) by measuring charging time and voltage across a predefined capacitor.

In some examples, voltage across the capacitor is checked continuously to be among the predefined voltage range. Once the minimum limit is reached, the voltage level is stored, as well as the number of time slots needed to achieve that voltage level. For each time step, several inductance values can be measured providing that the measured voltage is between the range. Else, it is moved to the next time step. Consequently, with the combination of measured voltage and charging time, one could detect 0.1 uH variation of inductance in range of 0.5 uH to 6 uH. For instance, the look up table 2 (sample data) can be established in order to estimate the value of the inductance from the raw data (voltage and time).

Table 2 shows an example of look up table that stores a relationship between measured data and inductance value.

TABLE 2

| Voltage (V) | Time (ns) | |
|---|---|---|
| | 900 | 1000 |
| 0.9882 | 3 µH | |
| 0.8281 | 3.1 µH | |
| 1.9140 | | 3.2 µH |
| 1.7265 | | 3.3 µH |

In some examples, data mining methods like linear regression, neural networks, machine learning, or other techniques could be useful to estimate the inductance value based on measured data (voltage and time).

Figure 7:
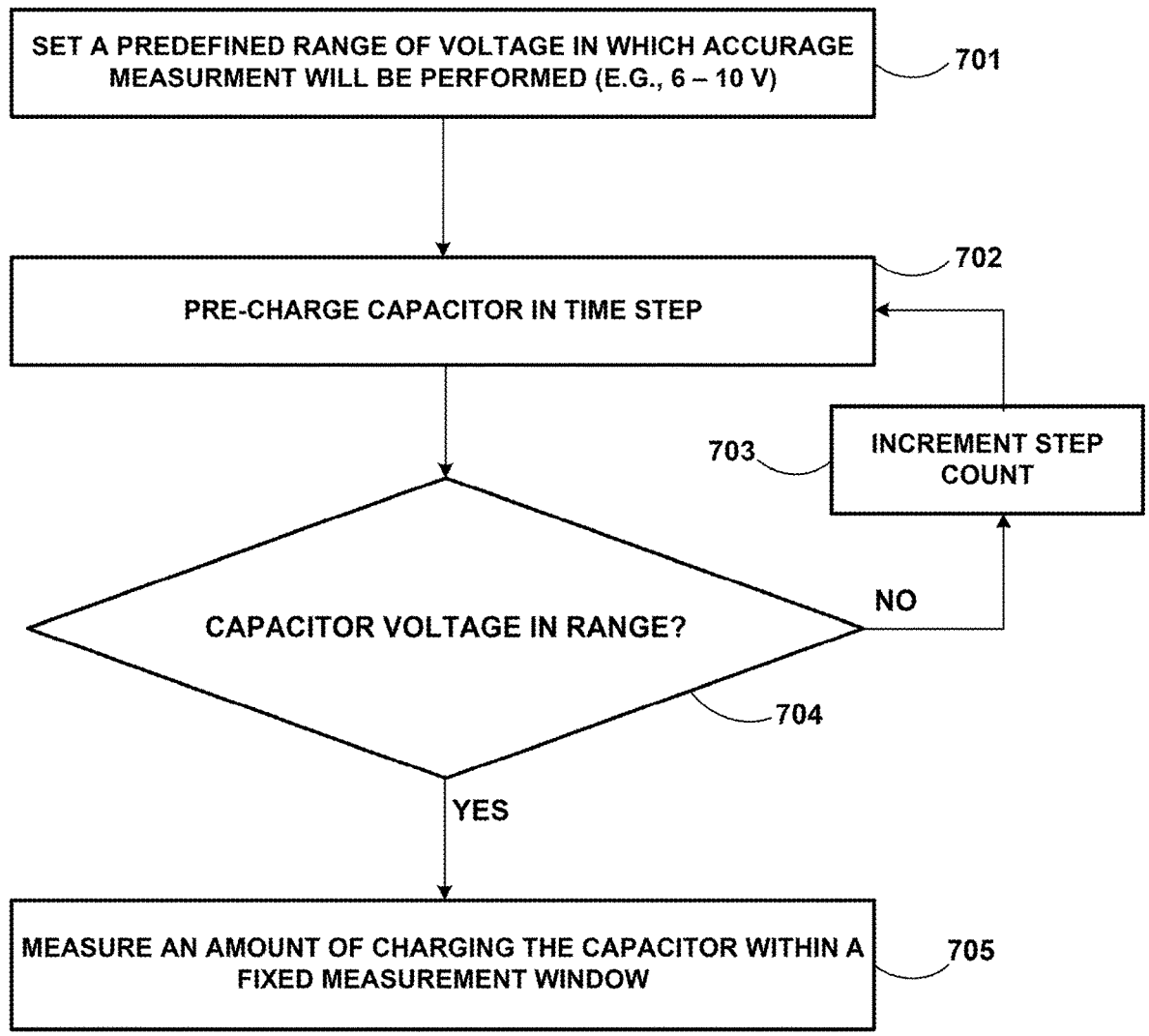
FIGS. 7 and 8 flow diagrams showing methods consistent with this disclosure.
Figure 8:
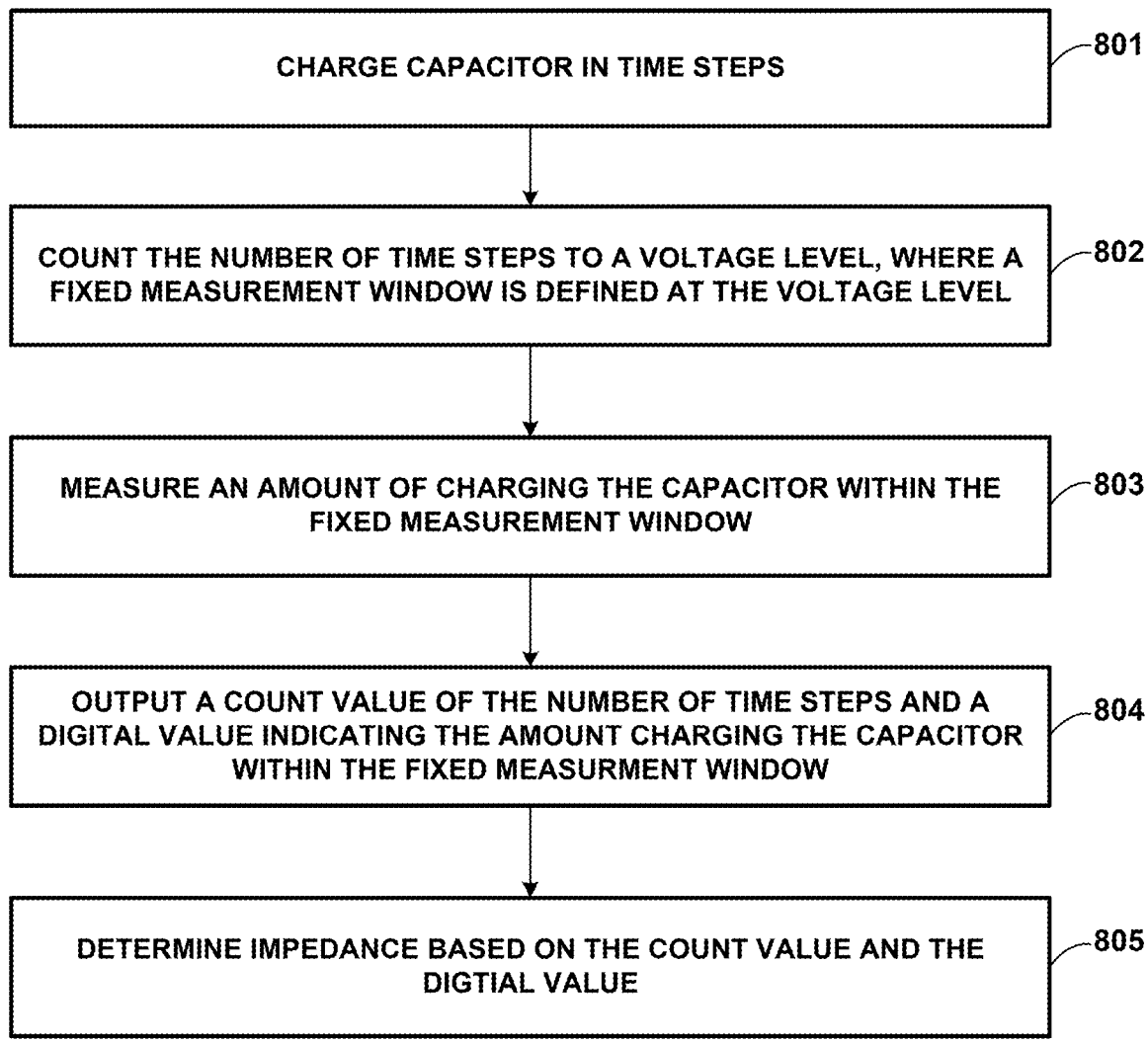

FIGS. 7 and 8 flow diagrams showing methods consistent with this disclosure, which may be performed at least in part by an inductance measurement circuit, such as any of inductance measurement circuits 108, 208, or 508. As shown in FIG. 7, a circuit sets a predefined range of voltages in which accurate measurements can be performed (701), such as 6-10 volts. The circuit pre-charges a capacitor in time steps (702). In particular, the circuit charges the capacitor (702), and checks whether the voltage on the capacitor is in a pre-defined range (704). If not (no branch of 704), the circuit increments a step count (703) and again pre-charges the capacitor for another step of time (702). Once the capacitor voltage is in range (e.g., once the voltage is between a voltage range or once the voltage reaches or satisfies a threshold voltage) (yes branch of 704), the circuit then measures an amount of charging the capacitor that occurs within a fixed measurement window (705). Again, the measurement window may correspond to a fixed and pre-known delay period associated with circuit operation.

As shown in FIG. 8, an inductance measurement circuit, such as any of inductance measurement circuits 108, 208, or 508, is configured to charge a capacitor in time steps (801), and count the number of time steps to a voltage level (802). A fixed measurement window is defined at that voltage level, which again, may correspond to a fixed and pre-known delay period associated with circuit operation.

The circuit (e.g., inductance measurement circuit 108, 208, or 508) then measures an amount of charging of the capacitor that occurs within the fixed measurement window (803). The circuit outputs a count value of the number of charging time steps and outputs a digital value indicating the amount of additional charging that occurred within the fixed measurement window (804). A processor receives the values and determines a line impedance based on the received values (805).

In some cases, the number of time steps and the clock speed can be used to define the size of the measurement window for better or worse accuracy. More time steps at a faster clock speed, for example, can help reduce the size of the measurement window to get finer/better accuracy.

Consistent with FIGS. 7 and 8, in some examples, a method of determining inductance on an electrical line comprises charging a capacitor in time steps to a voltage level counting a number of the time steps to the voltage level, wherein the number of the time steps defines a coarse measurement inductance of the electrical line; measuring a charging rate associated with charging the capacitor within a measurement window that is defined at the voltage level, wherein the charging rate associated with charging the capacitor within the measurement window defines a fine measurement of the inductance of the electrical line; and outputting an indication of the number of time steps and an indication of the charging rate associated with charging the capacitor within the measurement window.

In some examples, outputting the indication of the number of time steps comprises outputting a count value, and outputting the indication of charging rate comprises outputting a digital value corresponding to an amount of charge that accumulates in the measurement window, wherein the measurement window is a fixed duration. As described herein, the measurement window may correspond to a fixed delay period that occurs after the capacitor is charged to the voltage level. According to this disclosure, the digital value may comprise fewer than 6 bits, and a clock frequency associated with measuring the charging rate may be on the order of 10 Megahertz.

The method may also include selecting the voltage level that defines the measurement window. Charging the capacitor in the time steps may comprise controlling one or more power switches to connect the capacitor to a supply voltage in the time steps. Each of the time steps may correspond to an increase in the voltage level associated with the coarse measurement. Measuring the charging rate may comprise detecting a change in a level of charge on the capacitor over the measurement window, wherein the measurement window has a fixed duration.

The methods described herein may provide advantages for measuring inductance. Firstly, the techniques may achieve a reduction in the size of an ADC and may improve the sensitivity of inductance measurements. In practice, the described inductance measurement circuits may be used within a smart fuse.

A first smart fuse use case may use the smart fuse as a wire harness verification and validation at an original equipment manufacturer (OEM) manufacturing end line. By using the described techniques, one can check and validate the conformity of a wire harness at the end of its fabrication process. To do so, an inductance map can be initially established for an ideal "golden" vehicle. Further, at the end of process the actual vehicle inductance map can be compared to the golden inductance map. Therefore, any variation of at least 0.1 µH can be detected in a comparison process. From there, it may also be possible to describe the position of the abnormality. Since the wire inductance is linear to wire length, one could detect a variation of wire length or misplacement in wire harness.

A second smart fuse use case may use the smart fuse as a wire harness modification detection and localization during the lifetime of a vehicle use. In this case, during the lifetime of the vehicle, subsequent measurements can be performed, and a comparison between the golden inductance map and the actual map can be performed. So, if there is a modification in wire harness (wire length modification, additional prohibited load, or other inductance-affecting features), it becomes possible to detect and localize them. Problems or misuse of wire harnesses can be detected Therefore, predictive maintenance becomes conceivable as well as easy diagnosis.

The techniques described in this disclosure may be implemented, at least in part, in circuitry, hardware, software, firmware or any combination thereof. For example, various aspects of the described techniques may be implemented within one or more logical elements, processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

It may also be possible for one or more aspects of this disclosure to be performed in software, in which case aspects of the techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

The following clauses may illustrate one or more aspects of the disclosure.

Clause 1—An inductance measurement circuit comprising: a capacitor connected to an electrical line; one or more circuit elements configured to charge the capacitor in time steps to a voltage level, wherein a number of the time steps to reach the voltage level defines a coarse measurement of inductance of the electrical line; and a detection circuit configured to measure a charging rate associated with charging the capacitor within a measurement window that is defined at the voltage level, wherein the charging rate associated with charging the capacitor within the measurement window defines a fine measurement of the inductance of the electrical line, and wherein a combination of the coarse measurement and the fine measurement defines inductance of the electrical line.

Clause 2—The inductance measurement circuit of clause 1, wherein the measurement window corresponds to a fixed delay period that occurs after the capacitor is charged to the voltage level.

Clause 3—The inductance measurement circuit of clause 1 or 2, further comprising: a counter configured to count the number of time steps and output an indication of the number of time steps to a processor; and an ADC configured to output a digital value to the processor, the digital value corresponding to an amount of charging the capacitor within the measurement window, wherein the measurement window has a fixed duration and wherein the amount of charging and the fixed duration defines the charge rate over the measurement window.

Clause 4—The inductance measurement circuit of clause 3, wherein the digital value comprises fewer than 6 bits.

Clause 5—The inductance measurement circuit of any of clauses 1-4, wherein a clock frequency associated with the detection circuit is on the order of 10 Megahertz.

Clause 6—The inductance measurement circuit of clause 3, wherein a bit depth associated with the digital value and a clock frequency associated with the detection circuit are defined based on a level of sensitivity to be achieved by the inductance measurement circuit.

Clause 7—The inductance measurement circuit of any of clauses 1-6, wherein the inductance measurement circuit comprises an integrated circuit formed in a common substrate of silicon.

Clause 8—The inductance measurement circuit of any of clauses 1-7, wherein the one or more circuit elements configured to charge the capacitor include a power switch configured to connect the capacitor to a supply voltage in the time steps.

Clause 9—The inductance measurement circuit of any of clauses 1-8, wherein each of the time steps corresponds to an increase in the voltage level associated with the coarse measurement.

Clause 10—The inductance measurement circuit any of clauses 1-9, wherein the detection circuit comprises a comparator circuit connected to each side of the capacitor, wherein the comparator circuit is configured to output a signal indicating an amount of charging within the measurement window, wherein the measurement window has a fixed duration and the amount of charging and the fixed duration defines the charge rate.

Clause 11—A method of determining inductance on an electrical line, the method comprising: charging a capacitor in time steps to a voltage level; counting a number of the time steps to the voltage level, wherein the number of the time steps defines a coarse measurement of inductance of the electrical line; measuring a charging rate associated with charging the capacitor within a measurement window that is defined at the voltage level, wherein the charging rate associated with charging the capacitor within the measurement window defines a fine measurement of the inductance of the electrical line; and outputting an indication of the number of time steps and an indication of the charging rate associated with charging the capacitor within the measurement window.

Clause 12—The method of clause 11, wherein outputting the indication of the number of time steps comprises outputting a count value, and wherein outputting the indication of charging rate comprises outputting a digital value corresponding to an amount of charge that accumulates in the measurement window, wherein the measurement window is a fixed duration.

Clause 13—The method of clause 12, wherein the digital value comprises fewer than 6 bits, and wherein a clock frequency associated with measuring the charging rate is on the order of 10 Megahertz.

Clause 14—The method of any of clauses 10-13, wherein the measurement window corresponds to a fixed delay period that occurs after the capacitor is charged to the voltage level.

Clause 15—The method of any of clauses 10-14, further comprising selecting the voltage level that defines the measurement window.

Clause 16—The method any of clauses 10-15, wherein charging the capacitor in the time steps comprises controlling a power switch to connect the capacitor to a supply voltage in the time steps.

Clause 17—The method any of clauses 10-16, wherein each of the time steps corresponds to an increase in the voltage level associated with the coarse measurement.

Clause 18—The method any of clauses 10-17, wherein measuring the charging rate comprises detecting a change in a level of charge on the capacitor over the measurement window, wherein the measurement window has a fixed duration.

Clause 19—A system comprising: a processor; and an inductance measurement circuit connected to the processor, the inductance measurement circuit comprising: a capacitor connected to an electrical line; one or more circuit elements configured to charge the capacitor in time steps to a voltage level, wherein a number of the time steps to reach the voltage level defines a coarse measurement of inductance of the electrical line; a detection circuit configured to measure a charging rate associated with charging the capacitor within a measurement window that is defined at the voltage level, wherein the charging rate associated with charging the capacitor within the measurement window defines a fine measurement of the inductance of the electrical line, and wherein a combination of the coarse measurement and the fine measurement defines inductance of the electrical line, wherein the detection circuit is configured to output indications of the coarse measurement and the fine measurement to the processor, and wherein the processor is configured to determine the inductance of the electrical line based on the indications of the coarse measurement and the fine measurement.

Clause 20—The system of clause 19, wherein the detection circuit includes: a counter configured to count the number of time steps and output an indication of the number of time steps to the processor; and an ADC configured to output a digital value to the processor, the digital value corresponding to a change an amount of charge that accumulates in the measurement window, wherein the measurement window is a fixed duration, wherein the indications of the coarse measurement and the fine measurement comprise the indication of the number of time steps and the digital value.

Clause 21—The system of clause 19 or 20, wherein the measurement window corresponds to a fixed delay period that occurs after the capacitor is charged to the voltage level.

Various aspects have been described in this disclosure. These and other aspects are within the scope of the following claims.

The invention claimed is:

1. An inductance measurement circuit comprising:
a capacitor connected to an electrical line;
one or more circuit elements configured to charge the capacitor in time steps to a voltage level, wherein a number of the time steps to reach the voltage level defines a coarse measurement of inductance of the electrical line; and
a detection circuit configured to measure a charging rate associated with charging the capacitor within a measurement window that is defined at the voltage level, wherein the charging rate associated with charging the capacitor within the measurement window defines a fine measurement of the inductance of the electrical line, and wherein a combination of the coarse measurement and the fine measurement defines inductance of the electrical line.

2. The inductance measurement circuit of claim 1, wherein the measurement window corresponds to a fixed delay period that occurs after the capacitor is charged to the voltage level.

3. The inductance measurement circuit of claim 1, further comprising:
a counter configured to count the number of time steps and output an indication of the number of time steps to a processor; and
an analog-to-digital converter (ADC) configured to output a digital value to the processor, the digital value corresponding to an amount of charging the capacitor within the measurement window, wherein the measurement window has a fixed duration and wherein the amount of charging and the fixed duration defines the charge rate over the measurement window.

4. The inductance measurement circuit of claim 3, wherein the digital value comprises fewer than 6 bits.

5. The inductance measurement circuit of claim 4, wherein a clock frequency associated with the detection circuit is on the order of 10 Megahertz.

6. The inductance measurement circuit of claim 3, wherein a bit depth associated with the digital value and a clock frequency associated with the detection circuit are defined based on a level of sensitivity to be achieved by the inductance measurement circuit.

7. The inductance measurement circuit of claim 1, wherein the inductance measurement circuit comprises an integrated circuit formed in a common substrate of silicon.

8. The inductance measurement circuit of claim 1, wherein the one or more circuit elements configured to charge the capacitor include a power switch configured to connect the capacitor to a supply voltage in the time steps.

9. The inductance measurement circuit of claim 1, wherein each of the time steps corresponds to an increase in the voltage level associated with the coarse measurement.

10. The inductance measurement circuit of claim 1, wherein the detection circuit comprises a comparator circuit connected to each side of the capacitor, wherein the comparator circuit is configured to output a signal indicating an amount of charging within the measurement window, wherein the measurement window has a fixed duration and the amount of charging and the fixed duration defines the charge rate.

11. A method of determining inductance on an electrical line, the method comprising:
charging a capacitor in time steps to a voltage level;
counting a number of the time steps to the voltage level, wherein the number of the time steps defines a coarse measurement of inductance of the electrical line;
measuring a charging rate associated with charging the capacitor within a measurement window that is defined at the voltage level, wherein the charging rate associated with charging the capacitor within the measurement window defines a fine measurement of the inductance of the electrical line; and
outputting an indication of the number of time steps and an indication of the charging rate associated with charging the capacitor within the measurement window.

12. The method of claim 11,
wherein outputting the indication of the number of time steps comprises outputting a count value, and
wherein outputting the indication of charging rate comprises outputting a digital value corresponding to an amount of charge that accumulates in the measurement window, wherein the measurement window is a fixed duration.

13. The method of claim 12, wherein the digital value comprises fewer than 6 bits, and wherein a clock frequency associated with measuring the charging rate is on the order of 10 Megahertz.

14. The method of claim 11, wherein the measurement window corresponds to a fixed delay period that occurs after the capacitor is charged to the voltage level.

15. The method of claim 11, further comprising selecting the voltage level that defines the measurement window.

16. The method of claim 11, wherein charging the capacitor in the time steps comprises controlling a power switch to connect the capacitor to a supply voltage in the time steps.

17. The method of claim 11, wherein each of the time steps corresponds to an increase in the voltage level associated with the coarse measurement.

18. The method of claim 11, wherein measuring the charging rate comprises detecting a change in a level of charge on the capacitor over the measurement window, wherein the measurement window has a fixed duration.

19. A system comprising:
- a processor; and
- an inductance measurement circuit connected to the processor, the inductance measurement circuit comprising:
- a capacitor connected to an electrical line;
- one or more circuit elements configured to charge the capacitor in time steps to a voltage level, wherein a number of the time steps to reach the voltage level defines a coarse measurement of inductance of the electrical line;
- a detection circuit configured to measure a charging rate associated with charging the capacitor within a measurement window that is defined at the voltage level, wherein the charging rate associated with charging the capacitor within the measurement window defines a fine measurement of the inductance of the electrical line, and wherein a combination of the coarse measurement and the fine measurement defines inductance of the electrical line,
- wherein the detection circuit is configured to output indications of the coarse measurement and the fine measurement to the processor, and
- wherein the processor is configured to determine the inductance of the electrical line based on the indications of the coarse measurement and the fine measurement.

20. The system of claim 19, wherein the detection circuit includes:
- a counter configured to count the number of time steps and output an indication of the number of time steps to the processor; and
- an analog-to-digital converter (ADC) configured to output a digital value to the processor, the digital value corresponding to a change an amount of charge that accumulates in the measurement window, wherein the measurement window is a fixed duration,
- wherein the indications of the coarse measurement and the fine measurement comprise the indication of the number of time steps and the digital value.

21. The system of claim 19, wherein the measurement window corresponds to a fixed delay period that occurs after the capacitor is charged to the voltage level.

* * * * *